US010200222B2

(12) United States Patent
Hairfield et al.

(10) Patent No.: US 10,200,222 B2
(45) Date of Patent: Feb. 5, 2019

(54) LOW COST AND LOW FREQUENCY BASEBAND TWO-TONE TEST SET USING DIRECT DIGITAL SYNTHESIZERS AS SIGNAL GENERATORS AND A FULLY DIFFERENTIAL AMPLIFIER AS THE POWER COMBINER

(71) Applicant: Raytheon Company, Waltham, MA (US)

(72) Inventors: David Allen Hairfield, Tucson, AZ (US); Michael G. Carlsen, Tucson, AZ (US); Ryan G. Beck, Tucson, AZ (US); Shawna L. Ong, Tucson, AZ (US); Colt James, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/420,816

(22) Filed: Jan. 31, 2017

(65) Prior Publication Data

US 2018/0219705 A1    Aug. 2, 2018

(51) Int. Cl.
*H04L 25/08* (2006.01)
*H04L 25/03* (2006.01)
*H04B 3/46* (2015.01)

(52) U.S. Cl.
CPC ............. *H04L 25/085* (2013.01); *H04B 3/46* (2013.01); *H04L 25/03159* (2013.01); *H04L 2025/03356* (2013.01)

(58) Field of Classification Search
CPC ..................................................... H04L 25/085

USPC ........................................................ 375/224
See application file for complete search history.

(56) References Cited

U.S. PATENT DOCUMENTS

| 5,166,635 | A | 11/1992 | Shih |
| 5,235,455 | A * | 8/1993 | Berry ................... H04B 10/291 342/54 |
| 6,297,649 | B1 * | 10/2001 | Tsironis .................. H01P 1/212 324/629 |
| 6,617,938 | B1 | 9/2003 | Komiak |
| 2002/0127986 | A1 | 9/2002 | White et al. |
| 2004/0232988 | A1 * | 11/2004 | Nakatani ............. H03F 3/45089 330/252 |
| 2006/0268182 | A1 | 11/2006 | Shields |
| 2009/0033375 | A1 | 2/2009 | Max et al. |

(Continued)

OTHER PUBLICATIONS

"International Application Serial No. PCT/US2017/063962, International Search Report dated Feb. 6, 2018", 2 pgs.

(Continued)

*Primary Examiner* — Lihong Yu
(74) *Attorney, Agent, or Firm* — Schwegman Lundberg & Woessner, P.A.

(57) ABSTRACT

A test set system and related method are provided comprise a first direct digital synthesizer (DDS) having a balanced output configured to produce a first signal, and a second DDS having a balanced output signal configured to produce a second signal that differs from the first signal. The test set system also comprises a fully differential amplifier (FDA) having a balanced input that is connected to the balanced output of the first DDS and the balanced output of the second DDS, and a balanced output at which a combination of the first signal and the second signal is provided that suppresses even-order intermodulation products.

20 Claims, 5 Drawing Sheets

(56) References Cited

U.S. PATENT DOCUMENTS

2010/0141339 A1* 6/2010 Day ............... H03F 1/3211
                                                    330/149
2011/0074475 A1* 3/2011 Akaike ............ H03L 7/085
                                                    327/156
2013/0282315 A1* 10/2013 Barczyk .......... G01R 19/2513
                                                    702/61

OTHER PUBLICATIONS

"International Application Serial No. PCT/US2017/063962, Written Opinion dated Feb. 6, 2018", 7 pgs.
Brandon, David, et al., "Synchronizing Multiple AD9915 DDS-Based Synthesizers", Analog Devices » AD9915; Application Note AN-1254, (Dec. 2013), 2 pgs.

* cited by examiner

LOW COST AND LOW FREQUENCY BASEBAND TWO-TONE TEST SET USING DIRECT DIGITAL SYNTHESIZERS AS SIGNAL GENERATORS AND A FULLY DIFFERENTIAL AMPLIFIER AS THE POWER COMBINER

GOVT. FUNDING

This invention was made with Government support under the ESSM Block II grant, contract no. N00024-15-C-5420, awarded by the U.S. Navy. The Government may have certain rights in this invention.

TECHNICAL FIELD

Various configurations of systems relating to a low frequency baseband two-tone test set using direct digital synthesizers as signal generators and a fully differential amplifier as the power combiner are discussed below.

BACKGROUND

Two-tone tests measure a non-linear device's response to two input signals of different frequencies, F1 and F2. A fully linear device outputs only F1 and F2, but a non-linear device (or an imperfect linear device) produces spurious products that are combinations of F1 and F2, specifically: $\pm M^*F1 \pm N^*F2$. These spurious products are either even order or odd order, determined by whether the sum of M and N is even or odd. Creating two-tone test setups to measure very high performance baseband circuits may be challenging. Traditionally, two generators are combined in a resistive power combiner. However, the low isolation of the combiner requires significant resistive padding of the generators to reduce self-intermodulation. The resultant combined signal then requires amplification by a very linear baseband amplifier. Various attempts have been made to address these problems, but existing configurations create new problems.

DETAILED DESCRIPTION

Figure 1:
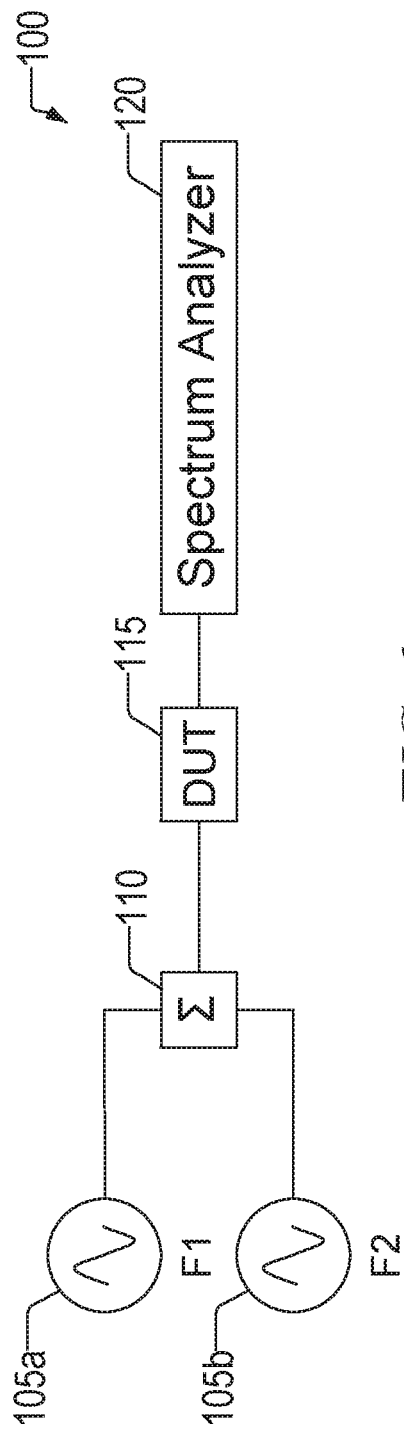
FIG. 1 is a block diagram that illustrates a test set system that is a general form of two-tone test hardware.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Two tone test sets combine signals from two generators. Creating a low frequency, multi-octave, high dynamic range two-tone test set has historically been a daunting task due to poor signal generator intermodulation susceptibility and lack of appropriate wideband combiners. Traditional methods for these test sets utilize laboratory signal generators, resistive power combiners, amplifiers, and attenuators. Resistive power combiners are virtually linear (no spurious contributions) across a wide range of frequencies, but have poor isolation, requiring significant attenuation to prevent the signal generators from producing spurious products. This considerable loss then has to be made back up with amplifiers, which are themselves vulnerable to intermodulation issues.

Disclosed herein, according to one configuration, is a test set system that comprises a first direct digital synthesizer (DDS) having a balanced output configured to produce a first signal, and a second DDS having a balanced output signal configured to produce a second signal that differs from the first signal. The test set system also comprises a fully differential amplifier (FDA) having a balanced input that is connected to the balanced output of the first DDS and the balanced output of the second DDS, and a balanced output at which a combination of the first signal and the second signal is provided that suppresses even-order intermodulation products.

Disclosed herein, according to one configuration, is also test set system that comprises a first DDS having a balanced output configured to produce a first sinusoidal signal, and a second DDS having a balanced output signal configured to produce a second sinusoidal signal that differs from the first sinusoidal signal. The test set system also comprises an FDA having a balanced input that is connected to the balanced output of the first DDS and the balanced output of the second DDS, and a balanced output at which a combination of the first sinusoidal signal and the second sinusoidal signal is provided. The FDA suppresses even-order intermodulation products. The test set system also comprises a balun connected to the output, which is a balanced output, of the FDA. The balun and that provides an unbalanced output. The balun comprises a first balun element operable within a first frequency range, a second balun element operable within a second frequency range that differs from the first frequency range, and a switch that activates either the first balun element or the second balun element. The switch is a frequency activated switch. The test set system also comprises a device under test (DUT) having an input that receives the output from the FDA. The test set also comprises a spectrum analyzer that receives a signal from the output of the FDA after passing through a device under test. A first isolating attenuator is connected between the first DDS and the FDA that reduces feedback from the FDA. A second isolating attenuator is connected between the second DDS and the FDA that also reduces feedback from the FDA.

Disclosed herein, according to one configuration, is also a method of operating a test set, comprising generating a first signal with a first direct digital synthesizer (DDS), generating a second signal that differs from the first signal with a second DDS, inputting the first and second signals to a fully differential amplifier (FDA), and outputting a combination of the first and second signals at an output of the FDA.

FIG. 1 is a block diagram that illustrates a test set system 100 that is a general form of two-tone test hardware comprising to signal generators 105a, 105b that produce two signals F1, F2 that are combined by a power combiner 110 and connected to an input of the device-under-test (DUT) 115. A spectrum analyzer 120 connected to an output of the DUT 115 measures the various spurious products. If the two input signals F1, F2 are of equal amplitude, the resultant levels of the second order and third order spurious products can be used to calculate second and third order intermodulation points IP2 and IP3, which are reported as either input-referred (IIP2/IIP3) or output-referred (OIP2/OIP3).

Complicating factors with this configuration, however, is that the test set system 100 must have better intermodulation (IM) performance than the DUT 115, generally self-producing tones at least 6 dB below those expected/specified for the DLT 115. When testing very high-performance DVTs 115, achieving an even better performing test set is problematic. The power combiner 110 has a finite isolation between its inputs, allowing the F2 signal back to the F1 generator 105a and the F1 signal back to the F2 generator 105b. This causes the generators 105a, 105b (collectively or representatively herein 105) themselves to produce intermodulation products.

Figure 2:
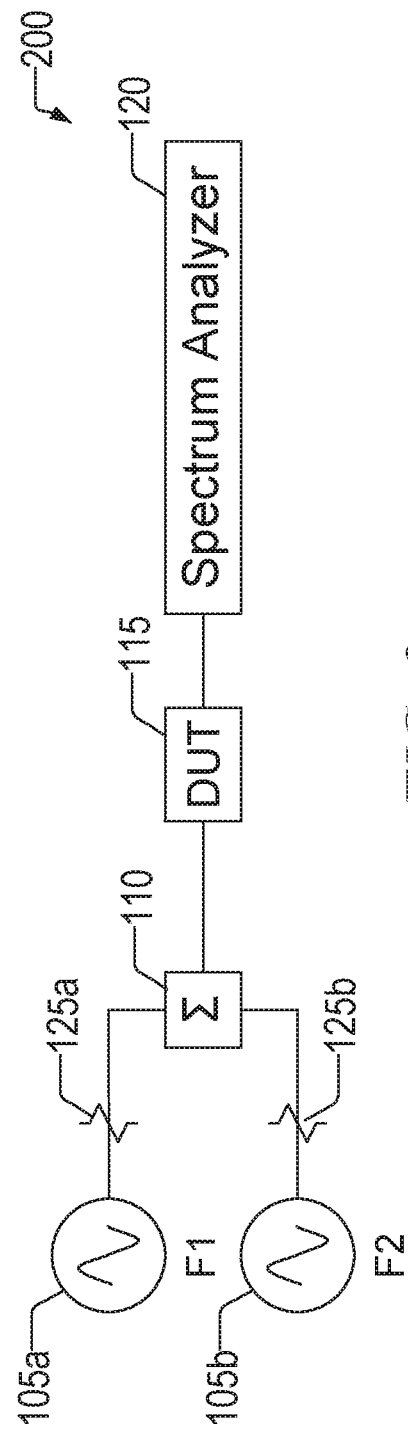
FIG. 2 is a block diagram of a test set system that adds isolating attenuators between the generators and the power combiner.

FIG. 2 is a block diagram of a test set system 200 similar to the one shown in FIG. 1, but that illustrates one possible solution to the issues noted above, which is to add isolating attenuators 125a, 125b between the generators 105a, 105b and the power combiner 110. Adding the isolating attenuators 125 minimizes the spurious products from the generators 105, that is, they reduce the signal levels feeding back from one generator to another, but they also lower the generators' 105 output power. As a result, not enough signal may be available to get the DUT 115 to produce measureable IM products—the attenuated signals may now be below the noise floor of the spectrum analyzer.

Figure 3:
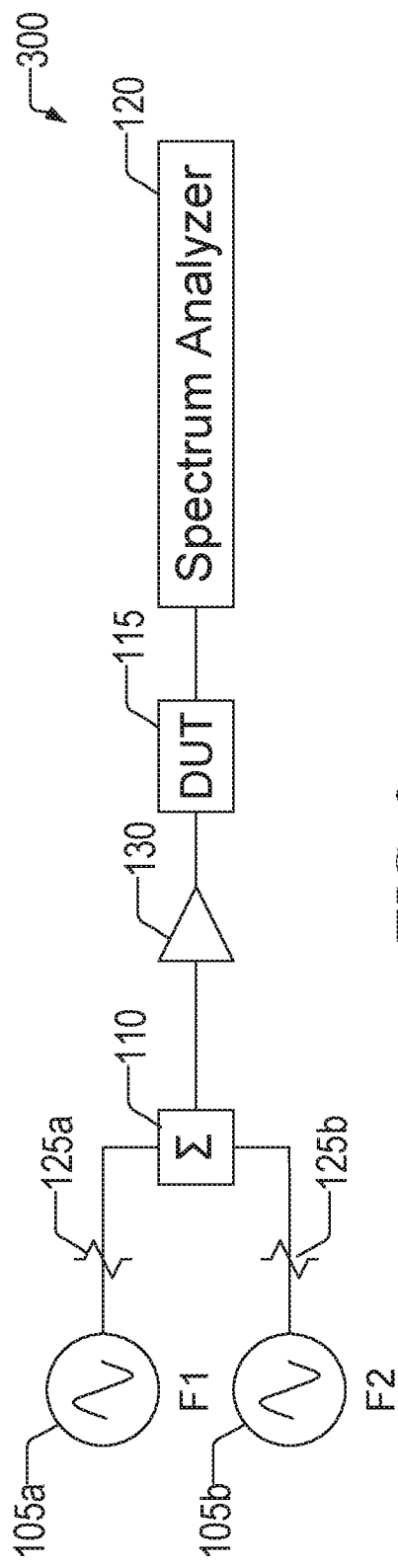
FIG. 3 is a block diagram of a test set system that illustrates the addition of an amplifier that is added after the power combiner.

FIG. 3 is a block diagram of a test set system 300 similar to the one shown in FIG. 2, but that illustrates one possible solution to the attenuation issue noted above. FIG. 3 illustrates the addition of an amplifier 130 that is added after the power combiner 110. Although this amplifier 130 increases the attenuated signal to recover signal levels reduced by the isolation attenuators 125, it also creates intermodulation products, and therefore, it should be carefully selected.

Another source of intermodulation distortion is the power combiner 110, which is optimized (and characterized) against a perfect load—however, it degrades significantly if it is presented with a mismatched load. The amplifier 130 (or DUT 115, if no amplifier is used) presents an imperfect match to the power combiner 110.

Figure 4:
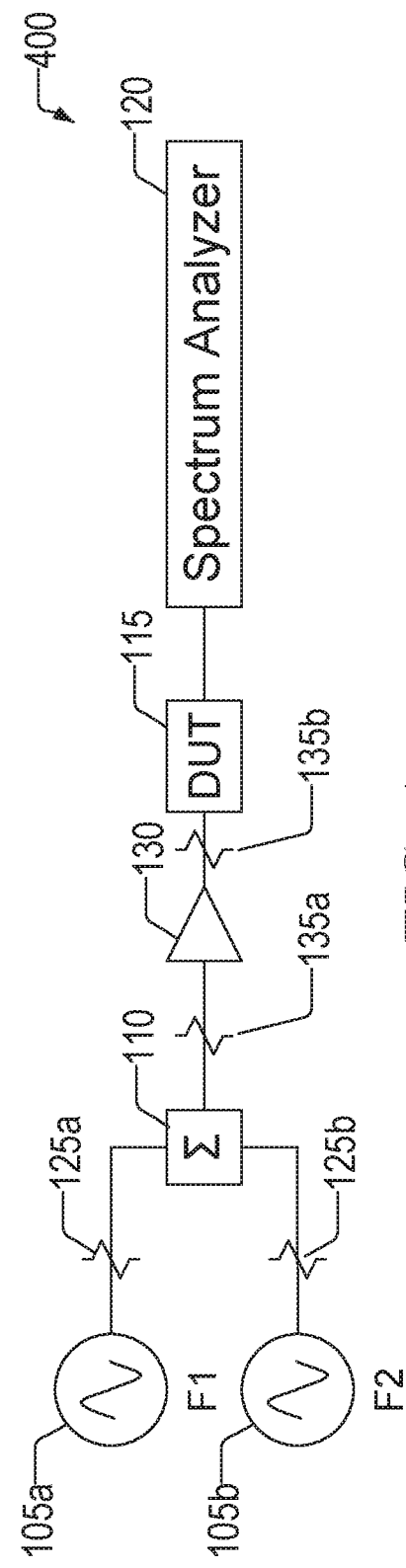
FIG. 4 is a block diagram of a test set system that illustrates the addition of another attenuator between the combiner and the amplifier.

FIG. 4 is a block diagram of a test set system 400 similar to the one shown in FIG. 3, but that illustrates one possible solution to the mismatched load noted above. FIG. 4 illustrates the addition of another attenuator 135a between the combiner 110 and the amplifier 130 (and/or an attenuator 135b between the amplifier 130 and the DUT 115) to minimize mismatches and improve intermodulation performance.

The above efforts become a balancing act between achieving excellent terminations and maintaining enough drive level. If the DUT 115 itself is sensitive to input mismatch, yet another attenuator may have to be added. One further complication is that at very low frequencies and over many decades of bandwidth (e.g., 1 kHz to 100 MHz), suitable reactive power combiners are rare.

Figure 5:
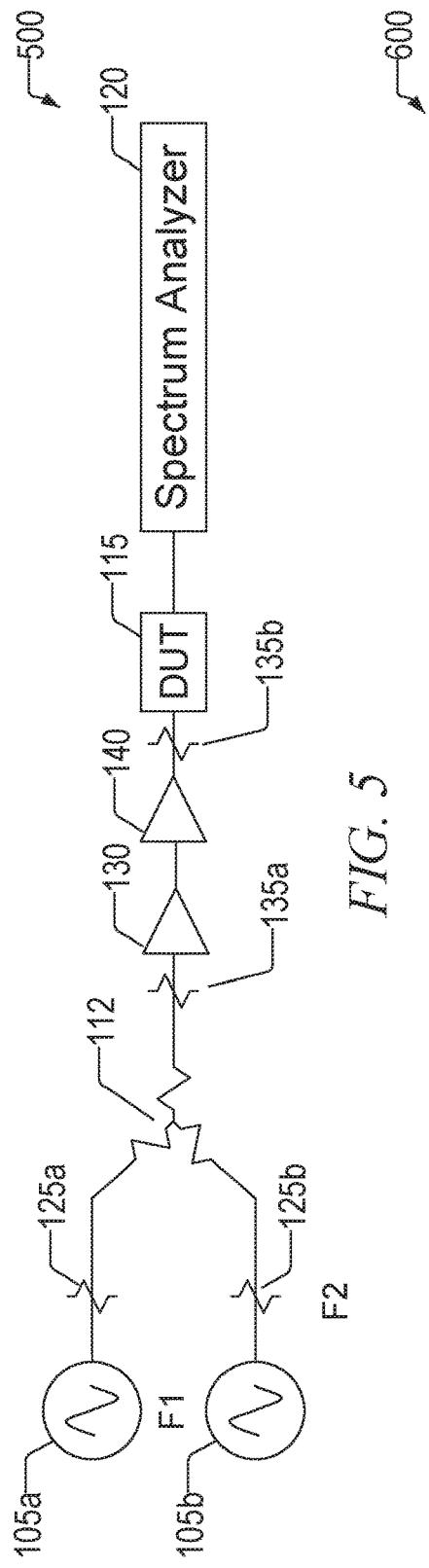
FIG. 5 is a block diagram of a test set system that illustrates the substitution of a resistive power combiner in place of the reactive power combiner

FIG. 5 is a block diagram of a test set system 500 similar to the one shown in FIG. 4, but that illustrates one possible solution to the balancing and bandwidth problems noted above. FIG. 5 illustrates the substitution of a resistive power combiner 112 in place of the reactive power combiner 110. The advantage of this is that the resistive power combiner provides an extremely wide range of frequency coverage with no intermodulation distortion. The disadvantage of this is that there is a 6 dB nominal power loss (vs. 3 dB for the reactive combiner), and there is only 6 dB isolation between input ports (vs. >25 dB for the reactive combiner).

The reduction in isolation means that the attenuators 125 following the generators 105 have to be increased by the reduction in combiner isolation typically around 20 dB. This added attenuation makes generating adequate signal levels much more difficult, with additional amplification 140 likely being required. The test set 500 becomes unwieldy, at best.

One desirable configuration would be to create a two-tone test set capable of generating two 0 dBm signals from 10 kHz to 70 MHz with a second-order output intercept point (OIP2)>90 dBm and a third-order output intercept point (OIP3)>45 dBm. Spurious tones would be suppressed 90 dBc from the desired tones, allowing accurate measurements of DUTs with up to −84 dBc spurious requirements. Because of the low frequency and multi-octave nature of these requirements, reactive power combiners are not readily available, and resistive power combiners have too much loss and too little isolation.

Figure 6:
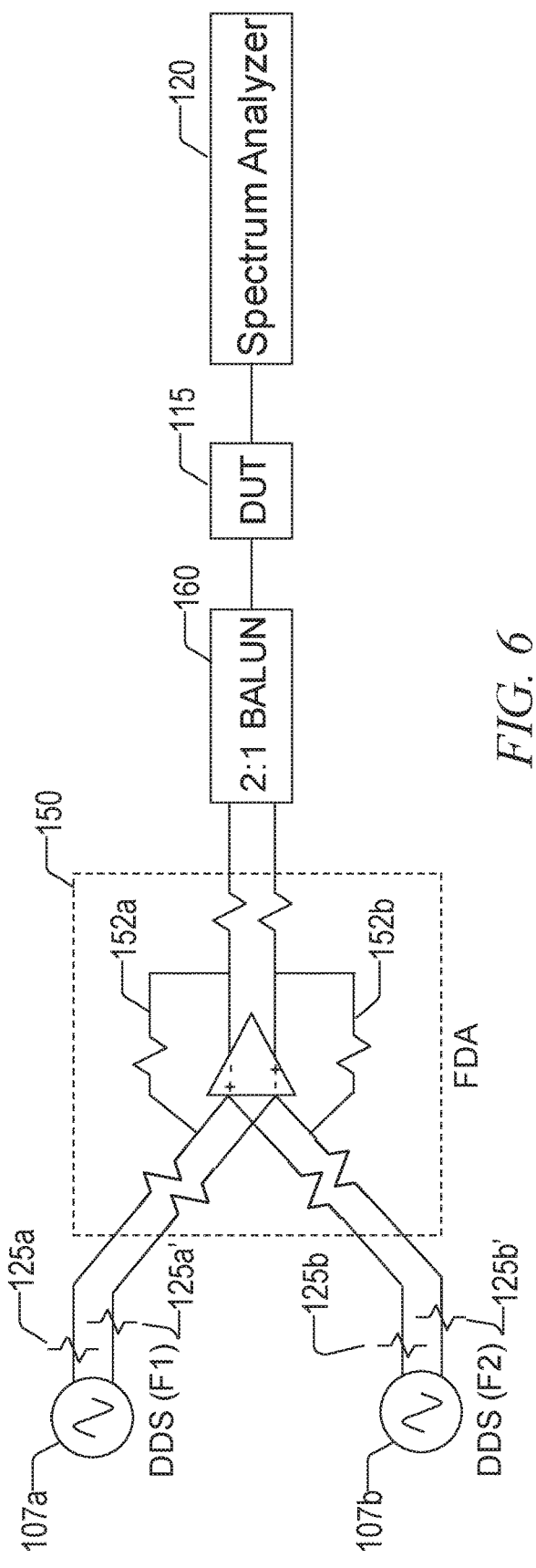
FIG. 6 is a block diagram of test set system, according to a configuration, that uses a fully differential amplifier and direct digital synthesizers.

FIG. 6 is a block diagram of test set system 600 for combining the signals, but that does not require significant attenuation or amplification, and that has excellent intermodulation (IM) performance. Although an operational amplifier may be used as the voltage summing device in DC and low frequency applications, their single-ended nature degrades even-order harmonic performance.

In the design of FIG. 6, a fully differential amplifier (FDA) 150 may be used as the combiner and provides desirable features of operational amplifiers, but also provides differential outputs—the differential operation suppresses even-order IM products. The FDA 150 is a DC-coupled high-gain electronic voltage amplifier with differential inputs and differential outputs. In its ordinary usage, the output of the FDA 150 is controlled by two feedback paths 152a, 152b which, because of the amplifier's high gain, almost completely determine the output voltage for any given input. In a fully differential amplifier, common-mode noise such as power supply disturbances is rejected; this makes IPDAs especially useful as part of a mixed-signal integrated circuit. The FDA 150 has its own gain, obviating the need for additional amplification. Like operational amplifiers, its active feedback provides excellent isolation between its input pins as long as the gain/bandwidth product is well below the specified limit. Example parts that may be utilized in the design include Linear Technology (presently owned by Analog Devices) LTC6409 K. Analog Devices ADA4930-1 & ADA4930-2, although most generic wideband FDAs may be substituted, including others by Linear Technology/Analog Devices and Texas Instruments.

Direct digital synthesizers (DDSs) 107a, 107b have an output that may be controlled by a digital translation of values from a look-up table and may utilize 3+ GHz clocks. Because of this, the DDSs 107 have excellent IM performance and are distortion resistant. The DDSs 107 can be configured to produce any waveform, so the test setup is not limited to continuous wave signals. The DDSs 107 also have differential outputs, providing natural suppression of even-order IM products and well matching the differential inputs of the FDA 150. Thus, FIG. 6 illustrates combining DDSs 107a, 107b in place of signal generators 105a, 105b, and an FDA 150 in place of the power combiner 110 to create a high dynamic range, low frequency, multi-decade two tone test set 60. Isolating attenuators 125a, 125a', 125b, 125b' may be provided in the differential outputs of the DDSs, and the values chosen to provide optimal isolation in the feedback path without undue attenuation in the signal. A 2:1 balun 160 may be used to convert the differential output signal provided by the FDA 150 to a signal provided to the DUT 115 for single-end testing (the FDA 150 may be directly connected to the DUT 115 for differential testing).

In one configuration, the balun 160 may be implemented by a switchable two balun device unit in which a first balun may be provided for a low end of a frequency range, and a second balun may be provided for a high end of the frequency range, since it may be difficult to find a single balun that covers the entire frequency range. A frequency based switch that triggers at some predefined frequency may be utilized to switch between the first (low frequency) balun and the second (high frequency) balun.

In order to perform dynamic switching of a balun to address frequency-in-use, according to an example, each DDS may be driven by a controller to a specific frequency output. Thus, this controller can determine the frequency that it will set for the DDS. This information may be used by the controller to switch to whichever balun is applicable for the DDS output frequency being selected. The dynamic nature of this control is limited simply by the controller's ability to determine the frequency to select (which could be pre-programmed or predictive) and the switch state time of the physical switch implemented. Tests of this configuration have indicated that the isolation between inputs of the FDA 150 is >25 dB and the FDA can be designed with a modest (0 dB to 6 dB) gain, and have good OIP2/OIP3 performance (better than 80 dB spur-tree dynamic range to both second-order and third-order spurious products from 100 kHz to 55 MHz (nine octaves)).

In order to ensure that the two DDS devices switch to the next output frequency that the controller is telling the DDS to switch to and that these outputs are phase aligned with the phase error between the devices minimized, Analog Devices has developed a DDS version that has a synchronization clock (sync elk). A discussion related to this and a generic description of a synchronization process may be found it http://www.radiolocman.com/shem/schematics.html?di=151017 (Analog Devices AD9915 Application Note AN-1254, December 2013, by David Brandon & Scott Shoaf).

The DDS synchronization clock, IO_Update signal, and the REF_CLK may all be combined in configurable logic (or externally in a discrete implementation) in order to gain accurate timing of the DDS output switch state and the balun switches. Knowing all of these different elements (sync signal, IO_update, ref_clk frequency, device delays, and the balun switch times) the controller can minimize the delay time between a frequency change command and the actualization of the new frequency state. In this manner, the level of dynamism built into the design are only limited to the accuracy of the signal timing measurements and device timing limitations. This method provides more accurate timing control vs. the prior art controller "pre-knowledge" method. The controller still determines the desired output frequency and when it would send the frequency change command to the DDS and the switch. However, in this DDS sync "sniffing" method. The controller can develop a much more accurate control method for switching and thus improve the dynamism of the system.

Figure 7:
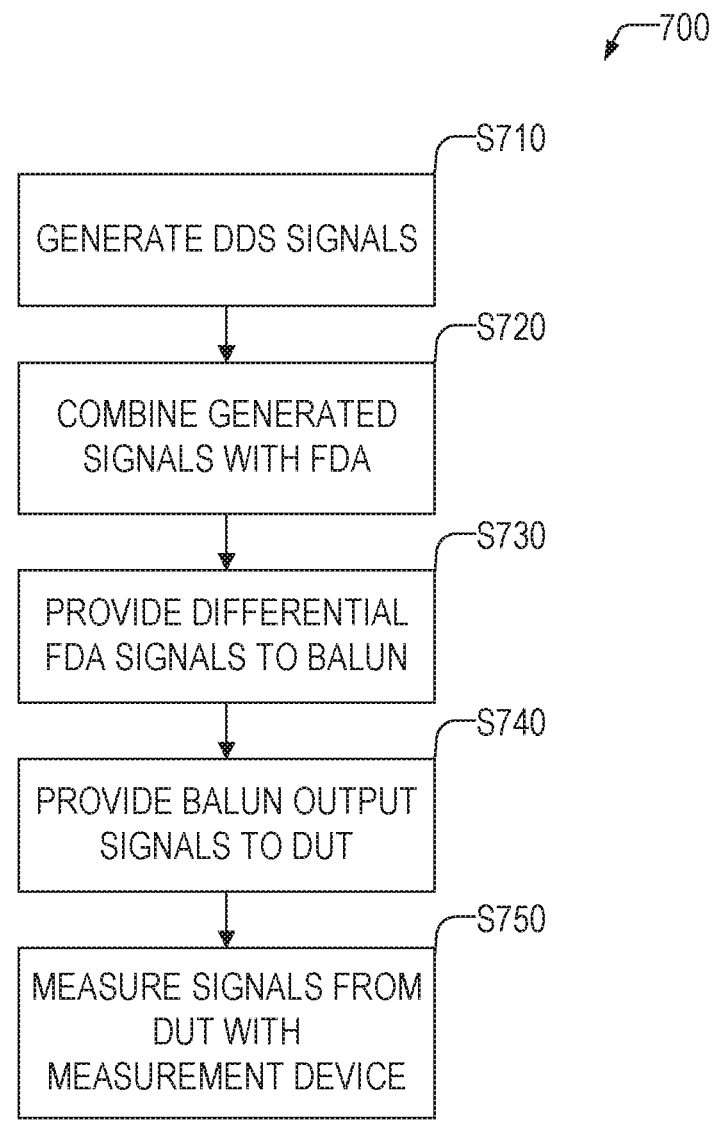
FIG. 7 is a flowchart illustrating operation of a test set system, according to a configuration.

FIG. 7 is a flowchart of a process 700, according to a configuration, for operating the test set. The DDSs generate the signals S710 that are then combined with the FDA S720. The balanced output signals of the FDA may be provided to a balun S730 to produce an unbalanced signal (this operation may be omitted if the DUT takes a balanced signal). The resultant signals are then provided to the DUT S740, and an output of the DUT is provided to a measurement device S750 for analysis.

A test set with very good performance characteristics, as described above, could be applied in many different technology areas. For example, it could be utilized to test state-of-the-art dubbing equipment or to quantify the performance of high-end stereo or concert equipment. The design may be employed in the test equipment industry to make better designs in various baseband applications within products designed for a variety of purposes.

Certain baseband applications are designed with a goal of getting the best performance out of the system as possible. Many of these systems have a built in limitation to meeting this performance, namely, the frequency at which they operate. A baseband system typically either arrives at the low frequency output by down conversion from a higher frequency, as is often the case in radar systems, or they operate in the low frequency area, such is the case in sonar, music audio applications, and medical devices focused on human or animal hearing.

In order to maximize the performance of these devices, the method of employing an FDA to improve the even order harmonic performance of a design will improve performance over traditional methods of going directly into an analog-to-digital converter. The presently disclosed two tone test solution has applicability in supporting a high degree of test measurements of the audio, sonar, and medical hearing equipment. The DDS control system could be used as a front end for a sonar generating system. The same methods employed to generated a two tone output for a test may be used to generate multiple sonar frequencies that may be received and combined through a single fully differential amplifier and sent on to a digitization device (analog-to-digital converter) for processing. This greatly simplifies the highly filtered and amplified sonar designs over known solutions.

Figure 8:
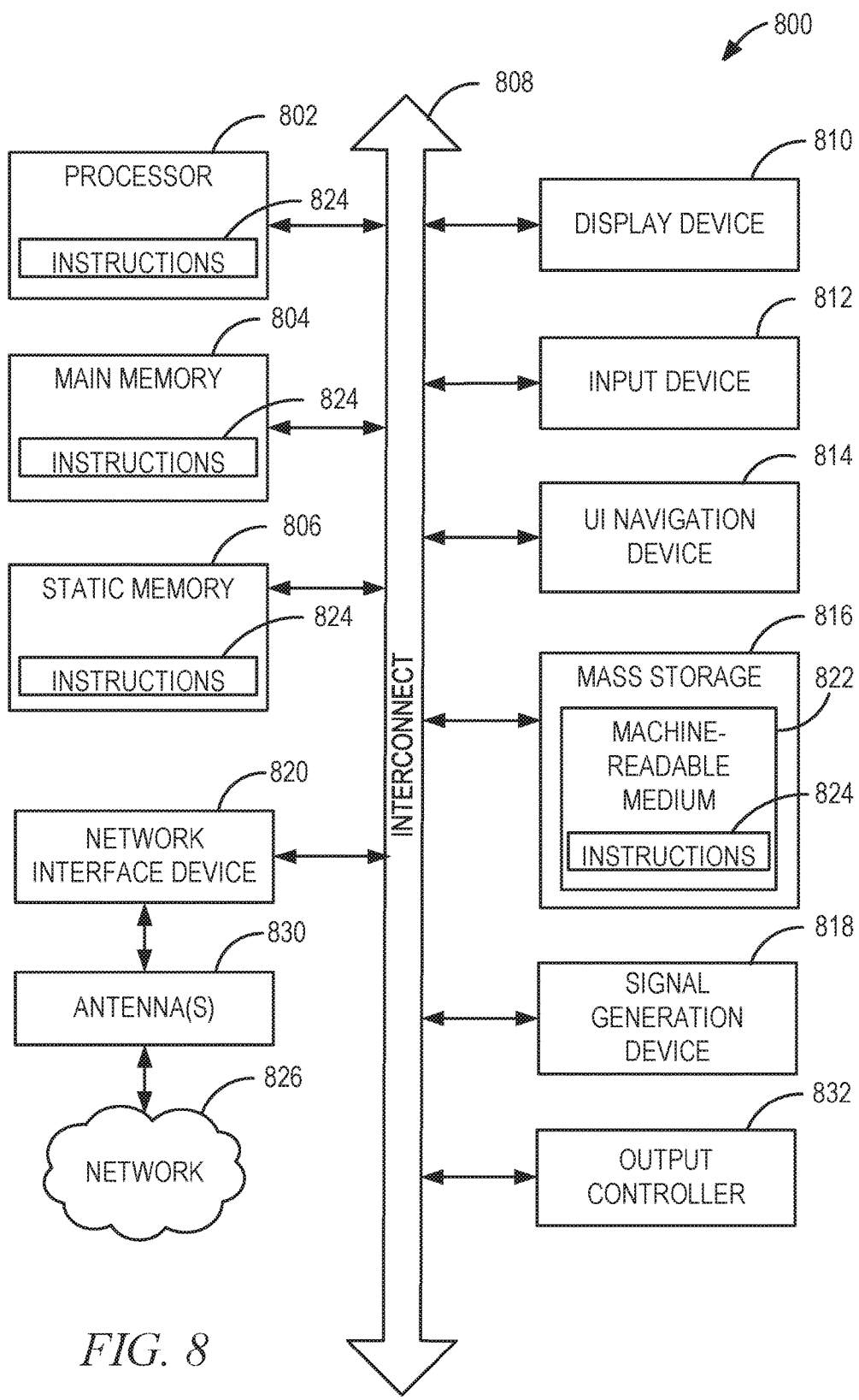
FIG. 8 is a block diagram that illustrates an example machine upon which any one or more of the techniques (e.g., methodologies) discussed herein may perform.

FIG. 8 is a block diagram that illustrates an example machine 800 upon which any one or more of the techniques (e.g., methodologies) discussed herein may perform. In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a user device, station, personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) 800 may include a hardware processor 802 (e.g., a central processing unit (CPU), a graphics processing unit (GPU), a hardware processor core, or any combination thereof), a main memory 804 and a static memory 806, some or all of which may communicate with each other via an interlink (e.g., bus) 808. The machine 800 may further include a display unit 810, an alphanumeric input device 812 (e.g., a keyboard), and a user interface (UI) navigation device 814 (e.g., a mouse). In an example, the display unit 810, input device 812 and. UI navigation device 814 may be a touch screen display. The machine 800 may additionally include a storage device (e.g., drive unit) 816, a signal generation device 818 (e.g., a speaker), a network interface device 820, and one or more sensors 821, such as a global positioning system (GPS) sensor, compass, accelerometer, or other sensor. The machine 800 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 816 may constitute machine readable media.

While the machine readable medium 822 is illustrated as a single medium, the term "machine readable medium" may include a single medium or multiple media (e.g., a centralized or distributed database, and/or associated caches and servers) configured to store the one or more instructions 824.

The term "machine readable medium" may include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 824 may further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques, In some examples, the network interface device 820 may wirelessly communicate using Multiple User MIMO techniques. The term "transmission medium" shall be taken to include any intangible medium that is capable of storing, encoding or carrying instructions for execution by the machine 800, and includes digital or analog communications signals or other intangible medium to facilitate communication of such software.

The figures above illustrate various examples and configurations that may be used, but the embodiments are not limited to these examples or configurations. Some embodiments may not necessarily include all components shown in the figures, and some embodiments may include additional components. In some embodiments, one or more components may be used in place of one or more components shown in the figures and may provide same or similar functionality to components shown.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware. Embodiments described herein may be implemented into a system using any suitably configured hardware and/or software.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

The invention claimed is:

1. A test set system, comprising:
   a first direct digital synthesizer (DDS) comprising a first balanced output having a first output line and a second output line and configured to produce a first signal at a first frequency;
   a second DDS comprising a second balanced output signal having a first output line and a second output line and configured to produce a second signal at a second frequency that differs from the first frequency, the second DDS configured to produce the second signal simultaneously with the first DDS production of the first signal; and
   a fully differential amplifier (FDA) comprising:
     a balanced input having a first input connection and a second input connection, wherein:
       the first DDS first output line and the second DDS first output line are connected to the FDA first input connection; and
       the first DDS second output line and the second DDS second output line are connected to the FDA second input connection;
     and
     a balanced output having a first output connection and a second output connection at which a combination of the first signal and the second signal is provided that suppresses even-order intermodulation products while maintaining the first and second frequencies at the balanced output first and second output connections.

2. The test set system of claim 1, further comprising a balun connected to the output, which is a balanced output, of the FDA and that provides an unbalanced output.

3. A test set system, comprising:
   a first direct digital synthesizer DDS) comprising a balanced output configured to produce a first signal;
   a second DDS comprising a balanced output signal configured to produce a second signal that differs from the first signal; and
   a fully differential amplifier (FDA) comprising:
     a balanced input that is connected to the balanced output of the first DDS and the balanced output of the second DDS; and
     a balanced output at which a combination of the first signal and the second signal is provided that suppresses even-order intermodulation products; and
   a balun comprising:
     a balanced input connected to the FDA balanced output;
     an unbalanced output; a first balun element operable within a first frequency range;
     a second balun element operable within a second frequency range that differs from the first frequency range; and
     a switch that activates either the first balun element or the second balun element.

4. The test system of claim 3, wherein the switch is a frequency activated switch.

5. The test system of claim 1, wherein the first DDS and second DDS produce digital sinusoidal signals.

6. The test system of claim 1, further comprising a measurement instrument that receives a signal from the output of the FDA after passing through a device under test.

7. The test system of claim 6, wherein the measurement instrument is a spectrum analyzer.

8. The test system of claim 1, further comprising:
   a first isolating attenuator connected between the first DDS and the :FDA that reduces feedback from the FDA; and
   a second isolating attenuator connected between the second DDS and the FDA that reduces feedback from the FDA.

9. The test system of claim 1, further comprising:
   a device under test (DUT) comprising an input that receives the output from the FDA.

10. A test set system, comprising:
    a first direct digital synthesizer (DDS) comprising a balanced output configured to produce a first sinusoidal signal;
    a second DDS comprising a balanced output signal configured to produce a second sinusoidal signal that differs from the first sinusoidal signal;
    a fully differential amplifier (FDA) comprising:
      a balanced input that is connected to the balanced output of the first DDS and the balanced output of the second DDS; and
      a balanced output at which a combination of the first sinusoidal signal and the second sinusoidal signal is provided that suppresses even-order intermodulation products;
    a balun connected to the output, which is a balanced output, of the FDA and that provides an unbalanced output, wherein the balun comprises:
      a first balun element operable within a first frequency range;
      a second balun element operable within a second frequency range that differs from the first frequency range; and
      a switch that activates either the first balun element or the second balun element, wherein the switch is a frequency activated switch;
    a device under test (DUT) comprising an input that receives the output from the FDA;
    a spectrum analyzer that receives a signal from the output of the FDA after passing through a device under test;
    a first isolating attenuator connected between the first DDS and the FDA that reduces feedback from the FDA; and
    a second isolating attenuator connected between the second DDS and the FDA that reduces feedback from the FDA.

11. A method of operating a test set, comprising:
generating a first signal at a first balanced output having a first output line and a second output line at a first frequency with a first direct digital synthesizer (DDS);
generating a second signal at a second balanced output having a first output line and a second output line at a second frequency that differs from the first frequency with a second DDS, the second DDS configured to produce the second frequency simultaneously with the generation of the first signal;
inputting the first and second signals to a balanced input of a fully differential amplifier (FDA), the balanced input having a first input connection and a second input connection;
wherein:
the first DDS first output line and the second DDS first output line are connected to the FDA first input connection; and
the first DDS second output line and the second DDS second output line are connected to the FDA second input connection; and
outputting a combination of the first and second signals that suppresses even-order intermodulation products at a balanced output having a first output connection and a second output connection of the FDA while maintaining the first and second frequencies at the balanced output first and second output connections.

12. The method of claim 11, further comprising:
receiving a balanced output signal from the FDA at an input of a balun and providing an unbalanced output signal at an output of the balun.

13. A method of operating a test set, comprising:
generating a first signal with a first direct digital synthesizer (DDS);
generating a second signal that differs from the first signal with a second DDS;
inputting the first and second signals to a fully differential amplifier (FDA);
outputting a combination of the first and second signals at an output of the FDA;
receiving a balanced output signal from the FDA at an input of a balun and providing an unbalanced output signal at an output of the balun;
providing a first frequency range signal to a first balun element of the balun;
providing a second frequency range signal to a second balun element of the balun;
switching a signal received from the FDA output to the first balun element if its frequencies are primarily within the first frequency range; and
switching the signal received from the FDA output to the second balun element if its frequencies are primarily within the second frequency range.

14. The method of claim 13, further comprising:
activating the switch based on the signal received from the FDA.

15. The method of claim 11, wherein the first and second signals are digital sinusoidal signals.

16. The method of claim 11, further comprising:
receiving, by a measurement instrument, a signal from the output of the FDA after passing through a device under test.

17. The method of claim 11, further comprising:
passing an FDA feedback signal to an isolating attenuator connected between at least one of: a) the first DDS and b) the second DDS, and the FDA that reduces feedback from the FDA.

18. The method of claim 11, wherein:
an isolation between inputs of the FDA is >25 dB; and
second and third-order spurious products produced by the FDA are >80 dB within a frequency range of 100 kHz to 55 MHz.

19. A computer program product comprising one or more tangible computer readable non-transitory storage media comprising computer-executable instructions operable to, when executed by processing circuitry of a station, configure the station to:
generate a first signal at a first balanced output comprising a first output line and a second output line and having a first frequency with a first direct digital synthesizer (DDS);
generate a second signal at a second balanced output comprising a first output line and a second output line and having a second frequency that differs from the first frequency, the generation of the second signal being produced simultaneously with the generation of the first signal with a second DDS;
input the first and second signals via the first output lines and the second output lines of the first and second DDS to a balanced input of a fully differential amplifier (FDA); and
output a combination of the first and second signals at a balanced output of the FDA comprising a first output line and a second output line that suppresses even-order intermodulation products at a balanced output of the FDA while maintaining the first and second frequencies at the balanced output of the FDA.

20. The computer program product of claim 19, wherein the instructions are further operable to configure the station to:
pass an FDA feedback signal to an isolating attenuator connected between at least one of: a) the first DDS and b) the second DDS, and the FDA that reduces feedback from the FDA.

* * * * *

UNITED STATES PATENT AND TRADEMARK OFFICE
CERTIFICATE OF CORRECTION

PATENT NO. : 10,200,222 B2
APPLICATION NO. : 15/420816
DATED : February 5, 2019
INVENTOR(S) : Hairfield et al.

Page 1 of 2

It is certified that error appears in the above-identified patent and that said Letters Patent is hereby corrected as shown below:

In the Specification

In Column 1, Line 54, after "combiner", insert --;--

In Column 2, Line 45, delete "the. FDA" and insert --the FDA-- therefor

In Column 3, Line 3, delete "105bthat" and insert --105b that-- therefor

In Column 3, Line 17, delete "DLT" and insert --DUT-- therefor

In Column 3, Line 17, delete "DVTs" and insert --DUTs-- therefor

In Column 4, Line 12, delete "isolation typically" and insert --isolation-typically-- therefor In Column 4, Line 46, delete "IPDAs" and insert --FDAs-- therefor In Column 4, Line 54, delete "K." and insert --&-- therefor In Column 5, Line 35, delete "spur-tree" and insert --spur-free-- therefor In Column 5, Line 44, delete "it" and insert --at-- therefor In Column 7, Line 44, delete "and." and insert --and-- therefor In Column 8, Line 51, delete "techniques," and insert --techniques.-- therefor In the Claims In Column 9, Line 59, in Claim 3, delete "DDS)" and insert --(DDS)-- therefor Signed and Sealed this
Twenty-first Day of April, 2020

Andrei Iancu
*Director of the United States Patent and Trademark Office*

CERTIFICATE OF CORRECTION (continued)
U.S. Pat. No. 10,200,222 B2

In Column 10, Line 8, in Claim 3, delete "balum" and insert --balun-- therefor

In Column 10, Line 12, in Claim 3, delete "balum" and insert --balun-- therefor

In Column 10, Line 24, in Claim 8, delete "the :FDA" and insert --the FDA-- therefor